(12) United States Patent
Peng

(10) Patent No.: US 6,963,169 B2
(45) Date of Patent: Nov. 8, 2005

(54) ORGANIC ELECTRO-LUMINESCENCE DEVICE

(76) Inventor: Kuan-Chang Peng, 2F, No. 49-4, Guang Fuh Rd., Sec. 2, Hsinchu (TW)

( * ) Notice: Subject to any disclaimer, the term of this patent is extended or adjusted under 35 U.S.C. 154(b) by 0 days.

(21) Appl. No.: 10/798,255

(22) Filed: Mar. 12, 2004

(65) Prior Publication Data
US 2004/0169468 A1   Sep. 2, 2004

Related U.S. Application Data

(63) Continuation-in-part of application No. 09/986,845, filed on Nov. 13, 2001, now abandoned.

(51) Int. Cl.$^7$ ............................................... H01J 1/72
(52) U.S. Cl. ..................................................... 313/506
(58) Field of Search ............................ 313/495–7, 506, 313/509, 512; 427/66

(56) References Cited

U.S. PATENT DOCUMENTS

| | | | |
|---|---|---|---|
| 5,952,037 A | * | 9/1999 | Nagayama et al. ............ 427/66 |
| 5,990,615 A | * | 11/1999 | Sakaguchi et al. ........... 313/509 |
| 6,137,220 A | * | 10/2000 | Nagayama et al. .......... 313/506 |
| 6,441,551 B1 | * | 8/2002 | Abe et al. .................... 313/506 |

* cited by examiner

Primary Examiner—Renee Luebke
(74) Attorney, Agent, or Firm—Rosenberg, Klein & Lee

(57) ABSTRACT

The present invention provides an organic electro-luminescence (EL) device, comprising: a substrate; a plurality of first electrodes formed on the surface of the substrate; a plurality of divisions of organic layer, formed on the first electrodes and being superimposed perpendicularly upon the first electrodes, the organic layer comprising at least one organic EL layer; a plurality of second electrodes, formed on the organic layer; a plurality of bottom insulating pads, each disposed between the divisions of the organic layer and on the two sides of the organic layer; and a plurality of heat sinks formed of a metallic material, each disposed on one of the bottom insulating pads. A moisture absorber is provided between each of the bottom insulating pads and each of the heat sinks and a protective layer is provided on the surface of the device, so that there is space formed between the organic layer, the moisture absorber and the metallic heat sink to achieve cooling and avoiding the outside humidification functions to remarkably prolong the lifetime of the device.

15 Claims, 12 Drawing Sheets

ORGANIC ELECTRO-LUMINESCENCE DEVICE

This Patent Application is a Continuation-in-Part of Ser. No. 09/986,845, filed on 13 Nov. 2001, now abandoned.

BACKGROUND OF THE INVENTION

1. Field of the Invention

The present invention generally relates to an organic electro-luminescence (to be abbreviated as "EL" hereinafter) device, and more particularly, to an organic EL device having good cooling and dehumidification functions. Such an organic EL device employs a metallic heat sink and a moisture absorber that can effectively dissipate the heat and avoid the outside moisture to remarkably prolong the lifetime of the device.

2. Description of the Prior Art

In general, the major challenge that the state-of-the-art technology in organic EL displays (also know as OELDs) is facing is that the organic layer of an organic EL device easily reacts with moisture or oxygen to thus form dark spots, which may adversely affect the luminescence efficiency. Therefore, the lifetime of an organic EL device is closely linked to the cooling condition related to the great amount of heat generated during luminescence operation. On the other hand, the second electrode is easily short-circuited to the first electrode due to improper treatment on the boundary during device fabrication. Furthermore, the precision of matrix grid positioning when organic EL devices displaying the three primary colors (red, green and blue) are fabricated also results in another problem in the industry.

In order to overcome the above problems, some companies have developed a number of prior art organic EL displays. For example, in the U.S. Pat. No. 5,952,037, entitled "Organic electroluminescent display panel and method for manufacturing the same", there is disclosed an organic EL display panel, as shown in FIG. 1 and FIG. 2. The organic EL display panel has a plurality of emitting portions and the method for manufacturing the same comprises the steps of: forming a plurality of first display electrodes 12 on a substrate 10; forming, on the substrate 10 on which the first display electrodes 12 are formed, a first insulating layer by using a first insulating material; forming a second insulating layer by using a second insulating material; etching the second insulating layer through the openings of a photo mask by using a dry-etching or wet-etching, thereby forming a plurality of ramparts 14 and insulating stripes 18 projecting in a direction parallel to the substrate; wherein the insulating stripes 18 are formed on the ramparts 14 and thus overhanging portions 185 are formed since the insulating stripes 18 are wider than the ramparts 14; forming a shadow mask onto top surfaces of the insulating stripes 18, exposing only the overhanging portions 185 and the openings between the overhanging portions 185; forming an organic layer 16 by deposition onto the substrate 10 and the first display electrodes 12, wherein the width of an organic layer 16 is larger than the distance between two overhanging portions 185; forming a plurality of second electrodes 17 by deposition onto the organic layer 16; and finally, forming an protective sealing layer 19 on at least the second display electrodes. In addition, a first reflective layer 22 is further formed on the protective sealing layer 19, so that the light generated can be focused and emitted in the direction towards the substrate 10. However, a second reflective layer 24 can also be formed on the bottom surface of the substrate 10, so as to increase the luminescence efficiency.

Even though this prior art provides an organic EL display panel and method for manufacturing the same, which can prevent a short-circuit between the edge of the first electrode and the second electrode and also improve the precision of matrix grid positioning, however, there are still some problems, related to heat and moisture, left unsolved.

In addition, this prior art provided ramparts 14 and the insulating stripes 18 are formed by nonmetallic insulating material or photoresist polymer material. During the procedure, the nonmetallic material or the polymer material easily absorb the outside humidification or moisture. After forming a protective sealing layer 19, the humidification or moisture in ramparts 14 and the insulating stripes 18 will release. Therefore, it will seriously influence the luminescence efficiency and the lifetime of the OLED device.

SUMMARY OF THE INVENTION

Therefore, the present invention has been made to solve such problems in view of the forgoing status. It is the primary object of the present invention to provide an organic EL device having a good cooling function to effectively dissipate the heat, so as to remarkably prolong the lifetime of the device.

It is another object of the present invention to provide an organic EL device having good dehumidification functions to effectively avoid the outside moisture, so as to prevent the generation of undesirable dark spots.

It is still another object of the present invention to provide an organic EL device, in which a second electrode is easily fabricated and has good isolation from a first electrode.

It is yet another object of the present invention to provide an organic EL device, in which the precision of matrix grid positioning when organic EL devices displaying the three primary colors (red, green and blue) are fabricated is improved.

In order to achieve the foregoing objects, the present invention provides an organic EL device, comprising: a substrate; a plurality of first electrodes formed on the surface of said substrate; a plurality of divisions of the organic layer, formed on said first electrodes and being superimposed perpendicularly upon said first electrodes, said organic layer comprising at least one organic EL layer; a plurality of second electrodes formed on said organic layer; a plurality of bottom insulating pads, each disposed between said divisions of said organic layer and on the two sides of said organic layer; and a plurality of heat sinks formed of a metallic material, each disposed on one of said bottom insulating pads.

It is preferable that said organic layer is divided by forming said bottom insulating pads and said metallic heat sinks so that the matrix grids in said device are precisely positioned.

It is preferable that the heat generated during the luminescence of said organic layer is conducted through each of said bottom insulating pads and then dissipated from each of said metallic heat sinks.

It is preferable that a moisture absorber is provided between each of said bottom insulating pads and each of said metallic heat sinks and a protective layer is provided on the surface of said device, so that there is space formed between said organic layer, said moisture absorbers and said metallic heat sinks to achieve cooling and dehumidification functions.

It is preferable that a rampart is formed on each of said metallic heat sinks, wherein the width of said rampart is larger than said metallic heat sink and thus overhanging portions are formed, so that said organic layer is formed by using tilt evaporation to be wider than the distance between two of said overhanging portions and said second electrodes are formed by using vertical evaporation to be electrically isolated from said first electrodes.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention providing an organic EL device having good cooling and dehumidification functions can be exemplified by the preferred embodiments as described hereinafter.

Figure 1:
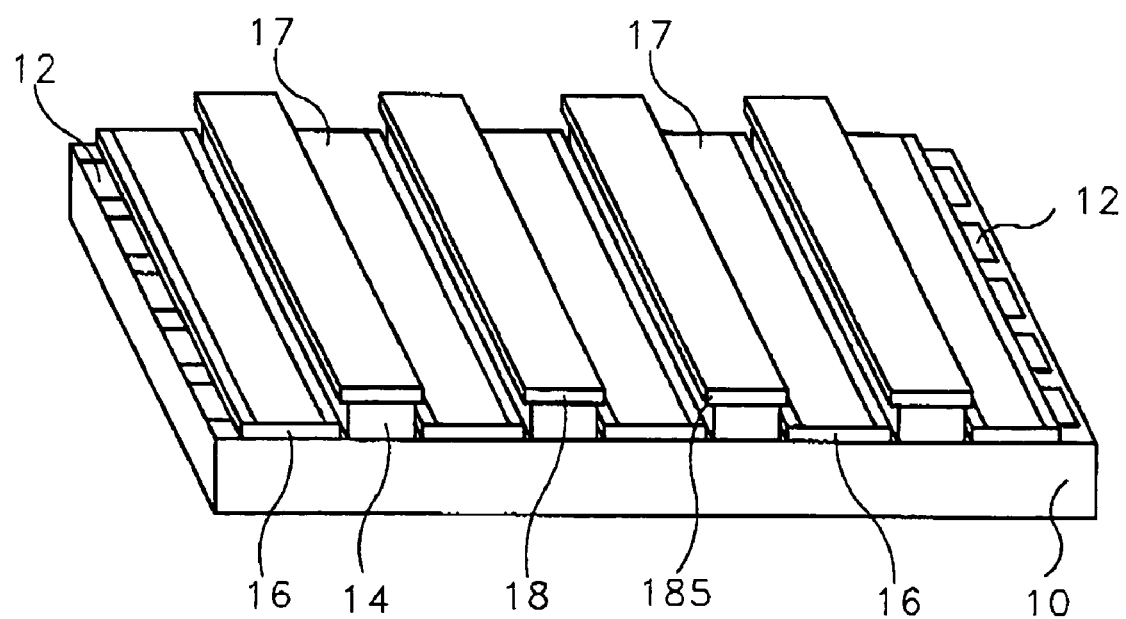
FIG. 1 is a 3D schematic view showing the structure of an organic EL device in accordance with the prior art.
Figure 2:
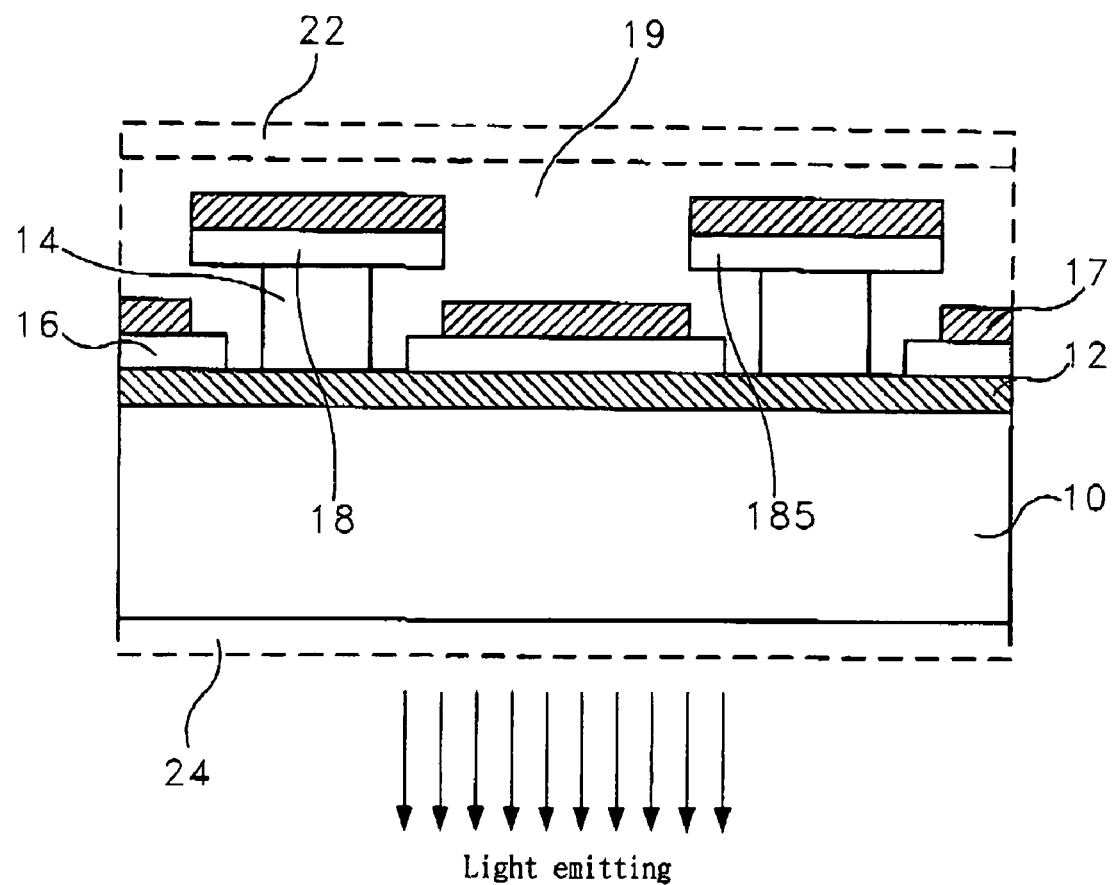
FIG. 2 is an enlarged cross-sectional view showing the structure of the organic EL device of FIG. 1.
Figure 3A:
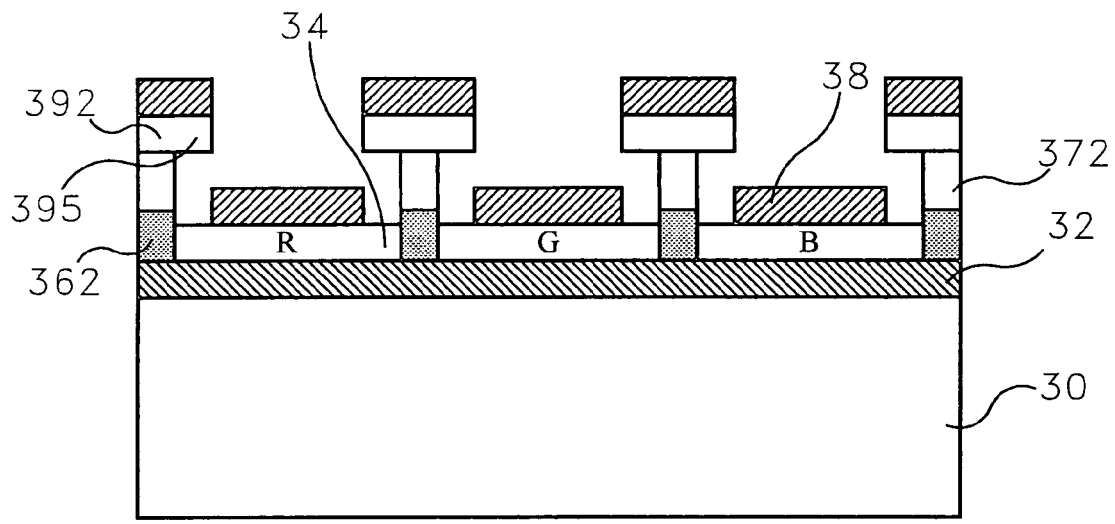
FIG. 3A is a cross-sectional view showing the structure of an organic EL device in accordance with one embodiment of the present invention.
Figure 3B:
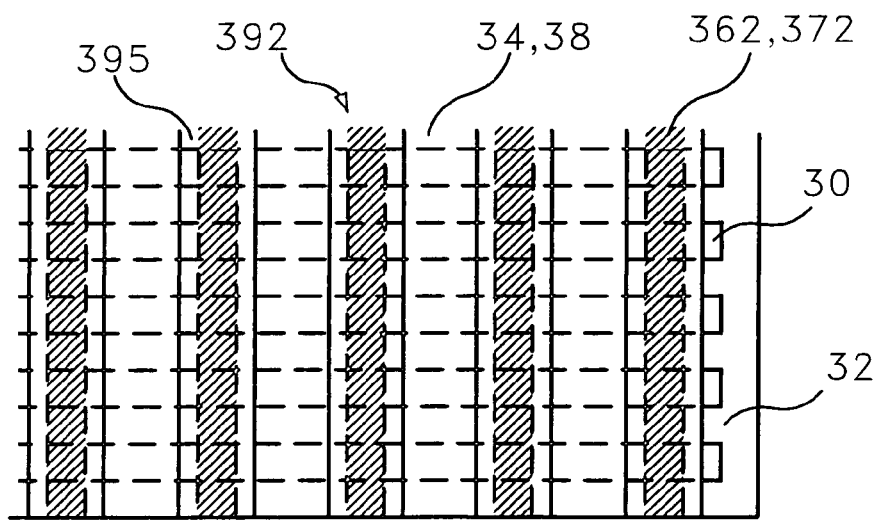
FIG. 3B is a vertical schematic view showing the embodiment as shown in FIG. 3A.

To start with, please refer to FIG. 3A and FIG. 3B, which are a cross-sectional view and a vertical view of the structure of an organic EL device in accordance with one embodiment of the present invention. As shown in the figures, the organic EL device comprises: a substrate 30; a plurality of first electrodes 32; a plurality divisions of an organic layer 34; a plurality of second electrodes 38; a plurality of bottom insulating pads 362; and a plurality of metallic heat sinks; wherein the first electrodes 32 are formed on the surface of the substrate 30; the organic layer 34 comprises at least one organic EL layer and is formed on the first electrodes 32 and is superimposed perpendicularly upon the first electrodes 32; a second electrode 38 is formed on each division of the organic layer 34; and the bottom insulating pads 362 are disposed between the divisions of the organic layer 34 and on the two sides of the organic layer 34, so that the organic layer 34 is divided and the matrix grids in the device are precisely positioned; the thickness of the bottom insulating pads 362 is larger than that of the organic layer 34 and a metallic heat sink 372 is disposed on each of the bottom insulating pads 362, so that the high temperature generated during the luminescence of the organic layer 34 can be conducted through each of the bottom insulating pads 362 and then dissipates. Therefore, the temperature during operation is lowered and the lifetime is prolonged. In addition, this can prevents a short circuit between the organic layer 34 and the metallic heat sink 372.

The present invention can also be implemented by using a rampart 392 formed on each of the metallic heat sinks 372, wherein the width of the rampart 392 is larger than the metallic heat sink 372 and thus overhanging portions 395 are formed, so that the organic layer 34 is formed by using tilt evaporation to be wider than the distance between two overhanging portions 395 and the second electrodes 38 are formed by using vertical evaporation to be electrically isolated from the first electrodes 32. The organic layer 34 can be one of a red light emitting organic layer (R), a green light emitting organic layer (G), a blue light emitting organic layer (B) and their combination.

The present invention uses the metallic heat sink 372, which is formed of a metallic material that the metallic material neither easily absorb the outside humidity or moisture, nor release the humidity or moisture in the protective layer to destroy the organic layer 34 after formation of a protective sealing layer (or overlaying protective case). Therefore the OLED device can be ensured of a high luminescence efficiency and a prolonged lifetime.

Figure 4A:
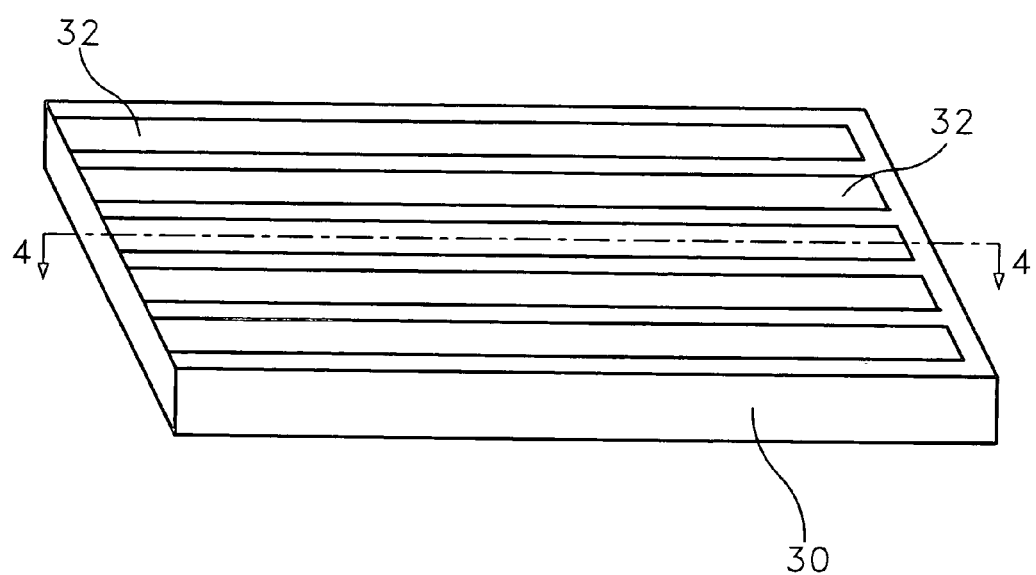
FIG. 4A is a 3D schematic view showing the process of the embodiment as shown in FIG. 3A.
Figure 4B:
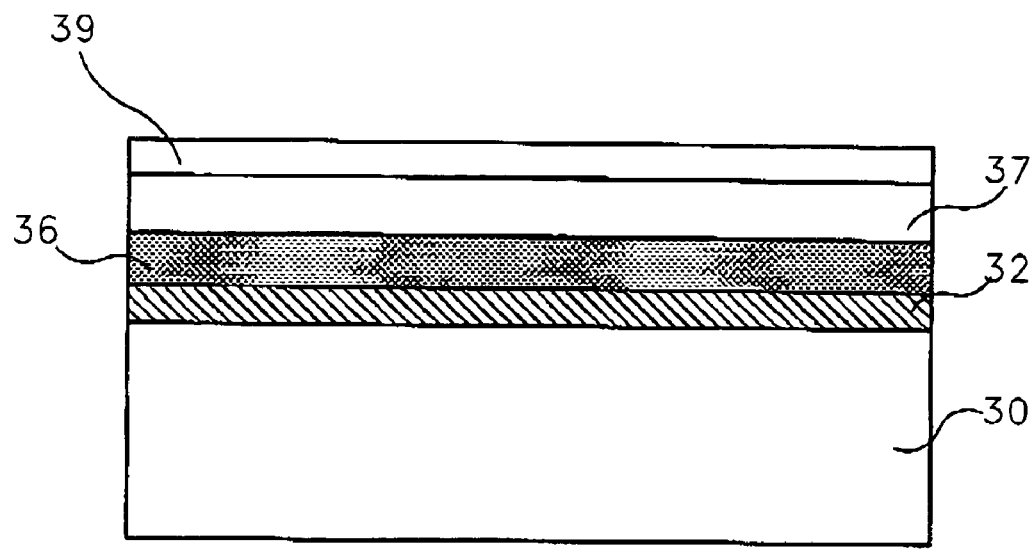
FIG. 4B to FIG. 4F are cross-sectional views showing the process of the embodiment along the line 4—4 as shown in FIG. 4A.
Figure 4C:
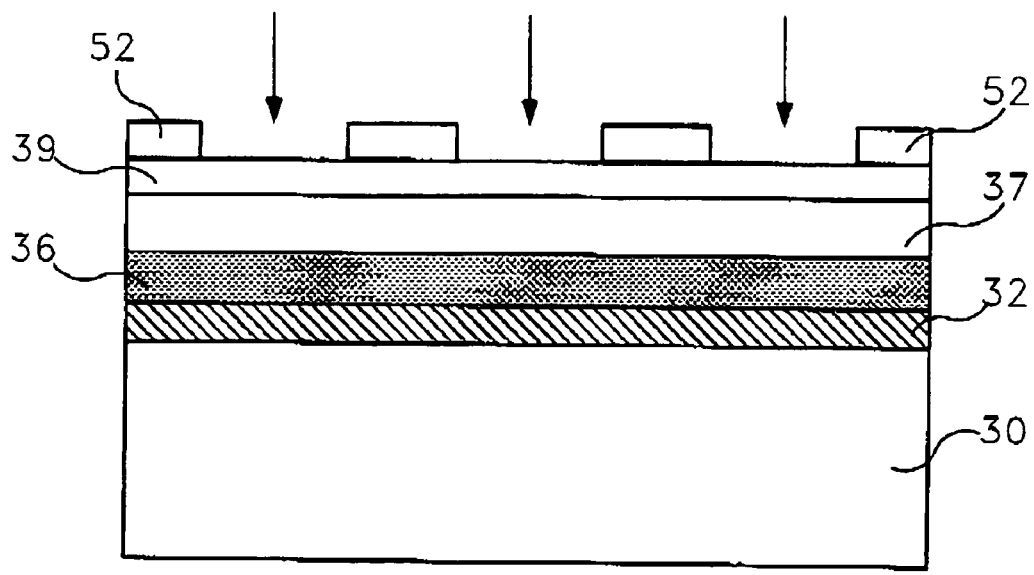
Figure 4D:
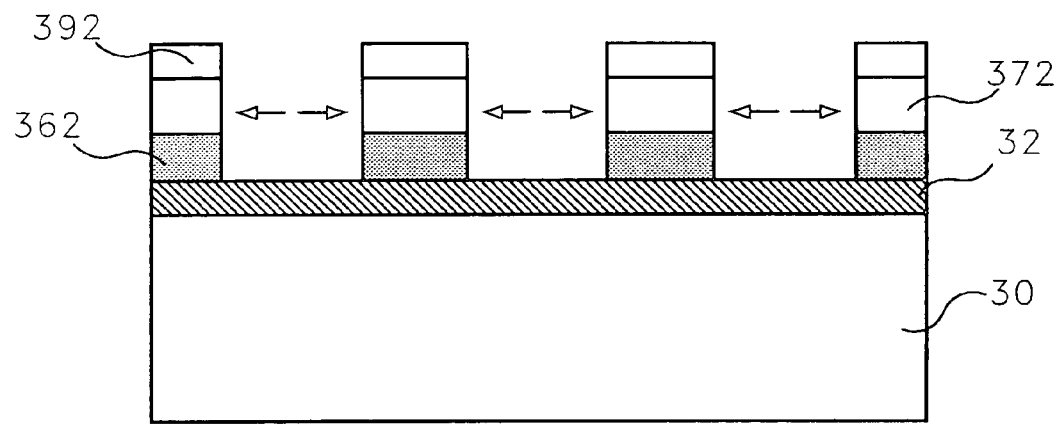
Figure 4E:
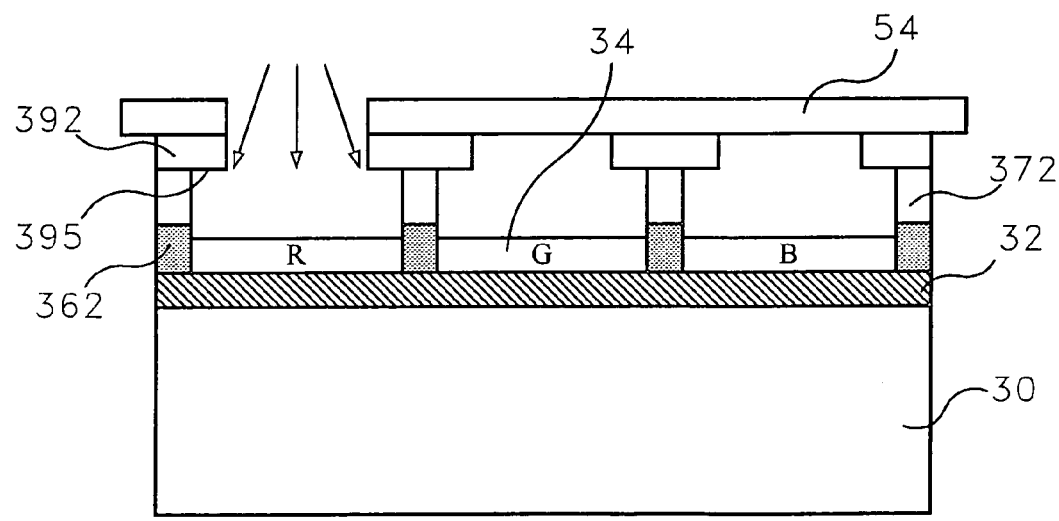
Figure 4F:
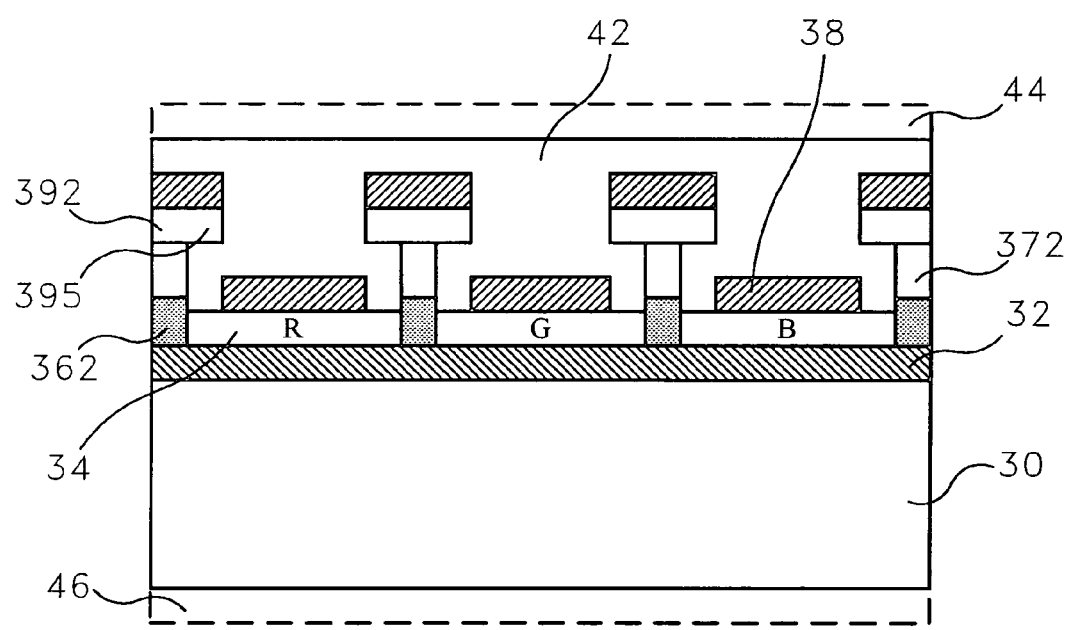

Please refer to FIG. 4A to FIG. 4F, which are schematic views showing the process of the embodiment as shown in FIG. 3A. As shown in the figures, a plurality of first electrodes 32 are formed on the surface of a substrate 30, and each of the first electrodes 32 are in parallel (as shown in FIG. 4A). A bottom insulating layer 36, a metallic heat sink layer 37, and a top rampart layer 39 are formed on the substrate 30 containing the first electrodes 32 (as shown in FIG. 4B). After a mask 52 is formed on the top rampart layer 39, the exposed portions of the bottom insulating layer 36, the metallic heat sink layer 37, and the top rampart layer 39 are removed by vertical etching, and thus bottom insulating pads 362, metallic heat sinks 372 and top ramparts 392 are formed (as shown in FIG. 4C and FIG. 4D). Overhanging portions 395 are formed by laterally etching the metallic heat sinks 372 and the top ramparts 392 (as shown in FIG. 4E). Then, a mask 54 covers the top ramparts 392, only exposing portions where the light of different colors is to be emitted, and the organic layer is formed by using tilt evaporation on the substrate 30 and the first electrodes 32 (as shown in FIG. 4E). Finally, vertical evaporation is performed through the opening between the overhanging portions 395 of the top ramparts 392 and thus the second electrodes 38 are formed (as shown in FIG. 4F).

To further protect the organic layer 34 as well as the whole body of the device, a protective layer 42 is provided on the surface of said device moreover. A reflective layer 44 can also be formed on the protective layer 42, so that the light generated from the organic layer 34 can be focused and emitted in the direction towards the substrate 30. However, a second reflective layer 46 can also be formed on the bottom surface of the substrate 30, so as to increase the luminescence efficiency. On the other hand, the bottom insulating pads 362 can be implemented by using an insulating material with moisture absorption function to absorb the moisture unable to eliminate during fabrication process, so that the undesired dark spots can be reduced.

Figure 5:
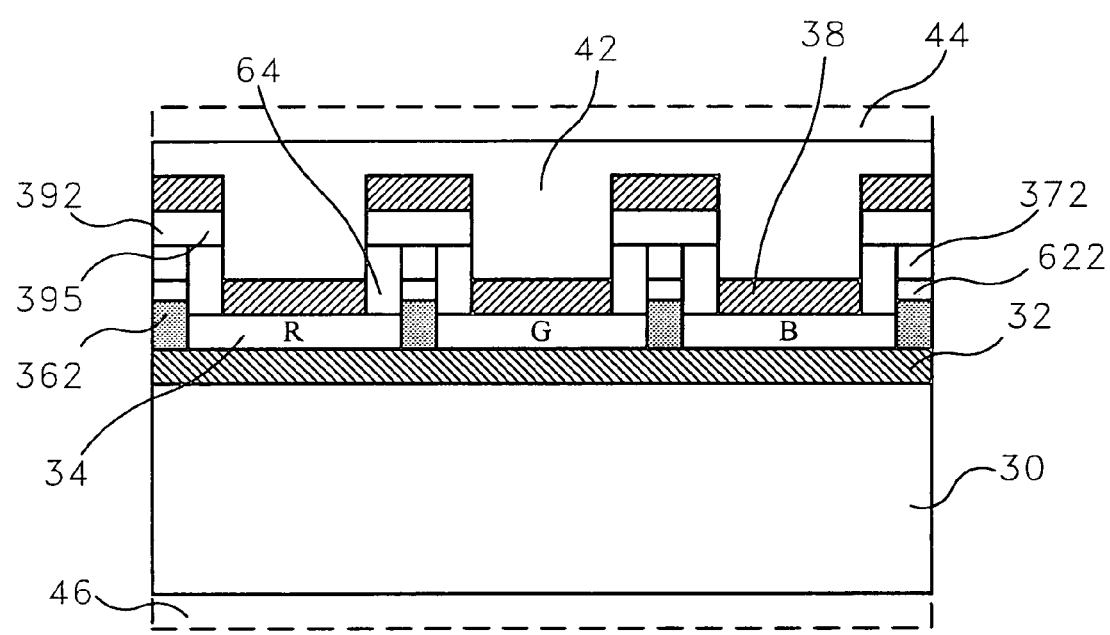
FIG. 5 is a cross-sectional view showing the structure of an organic EL device in accordance with another embodiment of the present invention.

Secondly, please refer to FIG. 5, which is a cross-sectional view showing the structure of an organic EL device in accordance with another embodiment of the present invention. As shown in the figure, the present embodiment is characterized in that moisture absorbers 662 implemented by using an insulating material with moisture absorption properties are formed between the bottom insulating pads 362 and the metallic heat sinks 372. The protective layer 42 does not necessarily fill in the device, so that there is space 64 formed between the organic layer 34, the second electrodes 38, the moisture absorbers 622 and the protective layer 42. Therefore, the moisture absorbers 622 absorb, from the organic layer 34 through the space 64, any residual moisture remaining from the fabrication process. The heat sinks are also improved in cooling efficiency by the flow of gas in the space 64. In the present embodiment, the moisture absorbers 622 do not contact the first electrodes 32, the organic layer 34 and the second electrodes 38; therefore, they can be formed by materials having moisture absorption properties, regardless of their insulating property. The bottom insulating pads 362 can also be made of general insulating materials. Accordingly, the present embodiment provides a wide range for material selection and ease in fabrication.

Figure 6:
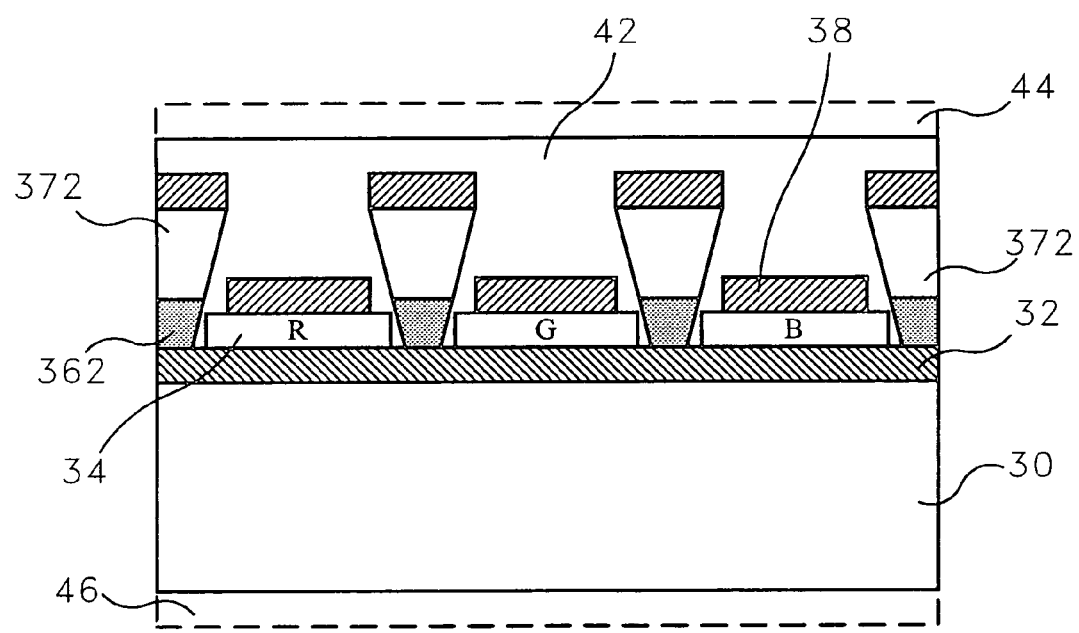
FIG. 6 is a cross-sectional view showing the structure of an organic EL device in accordance with still another embodiment of the present invention.

Moreover, please refer to FIG. 6, which is a cross-sectional view showing the structure of an organic EL device in accordance with another embodiment of the present invention. As shown in the figure, the present embodiment is similar to that in FIG. 4F. However, the metallic heat sinks 372 are formed by direct etching into a trapezoid shape, with a wider top side and a narrower bottom side, and function as the overhanging portions 395 in FIG. 4F.

Figure 7:
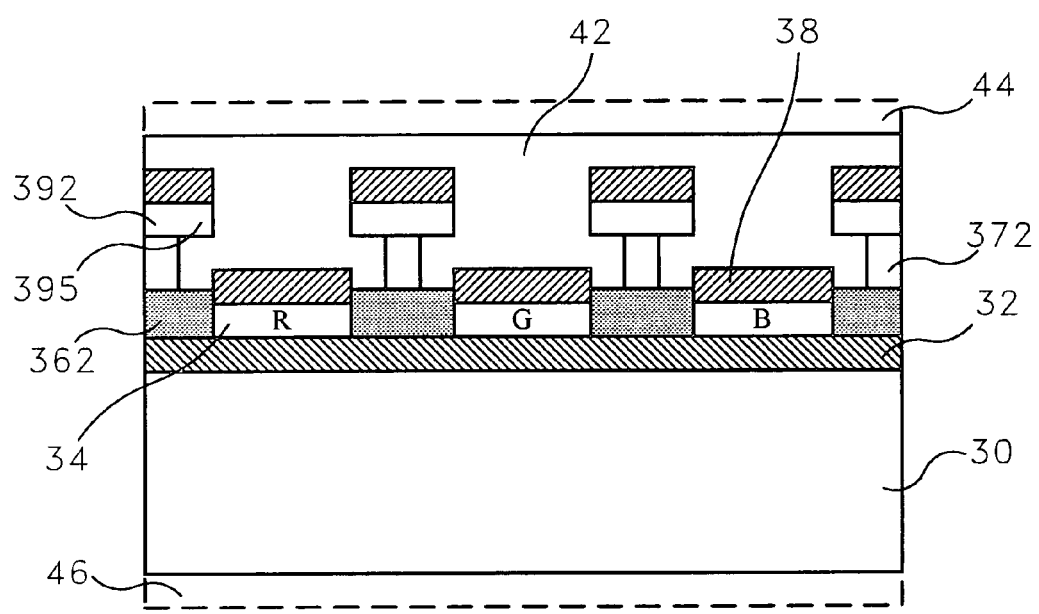
FIG. 7 is a cross-sectional view showing the structure of an organic EL device in accordance with still another embodiment of the present invention.

Moreover, please refer to FIG. 7, which is a cross-sectional view showing the structure of an organic EL device in accordance with another embodiment of the present invention. As shown in the figure, the present embodiment is similar to that in FIG. 4F. However, in the present embodiment, only the metallic heat sinks 372 are laterally etched, so that the width of the bottom insulating pads 362 is equal to that of the ramparts 392. Therefore, the organic layer 34 and the second electrodes 38 can be formed by vertical evaporation through the openings between the overhanging portions, so that the thickness of the organic layer 34 is smaller than that of the bottom insulating pads 362. The organic layer 34 is sealed inside the space surrounded by the first electrodes 32, the second electrodes 38 and the bottom insulating pads 362, so as to prevent a short circuit and to achieve cooling function.

Furthermore, according to the embodiment shown in FIG. 6, the metallic heat sinks 372 can be etched to form a trapezoid shape, with a wider top side and a narrower bottom side, so that the width of the bottom insulating pads 362 is equal to that of the top side of the metallic heat sinks 372. The organic layer 34 and the second electrodes 38 can be formed by using vertical deposition so that the thickness of the organic layer 34 is smaller than that of the bottom insulating pads 362. In this way, the first electrodes are isolated from the second electrodes.

Figure 8:
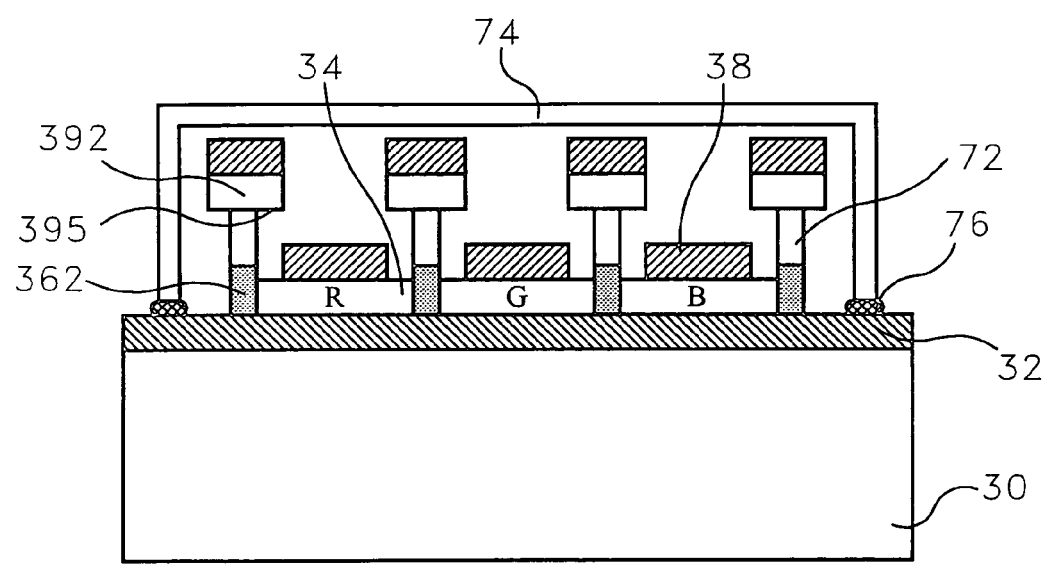
FIG. 8 is a cross-sectional view showing the structure of an organic EL device in accordance with still another embodiment of the present invention.

Please refer to FIG. 8, which is a cross-sectional view showing the structure of an organic EL device in accordance with another embodiment of the present invention. As shown in the figure, the present embodiment is similar to that in FIG. 4F. However, in the present embodiment, the metallic heat sinks 372 are replaced with moisture absorbers 72, and a protective case 74 is fixed to the substrate 30 containing the first electrodes 32 by using a sealing glue 76, thereby the device is sealed and protected to prevent the invasion of moisture.

Figure 9:
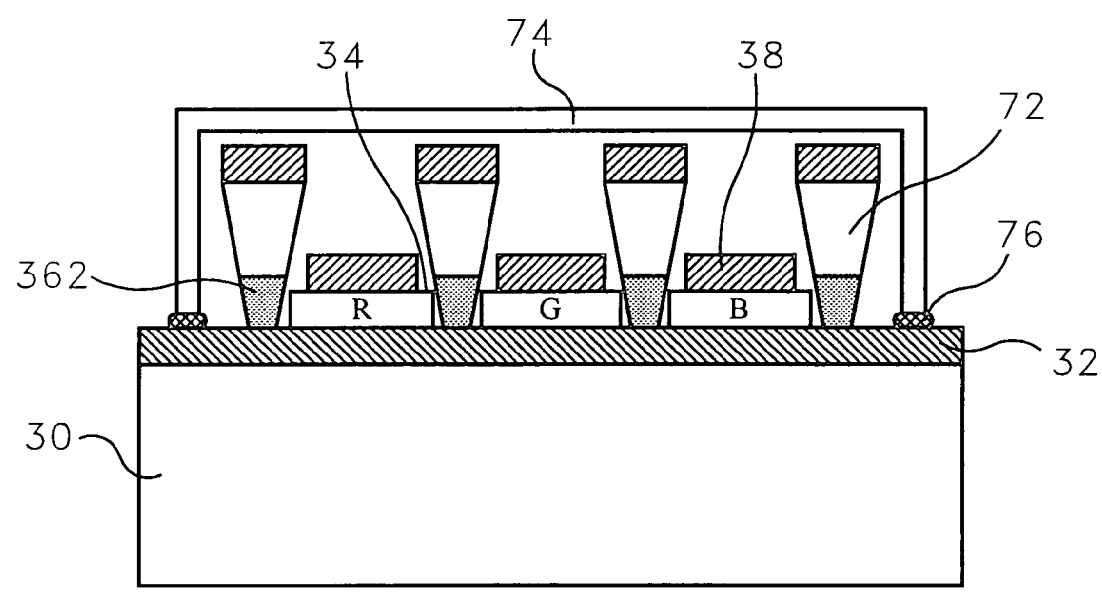
FIG. 9 is a cross-sectional view showing the structure of an organic EL device in accordance with still another embodiment of the present invention.

Finally, Please refer to FIG. 9, which is a cross-sectional view showing the structure of an organic EL device in accordance with another embodiment of the present invention. As shown in the figure, the present embodiment is similar to that in FIG. 6. However, in the present embodiment, the metallic heat sinks 372 are replaced with moisture absorbers 72 having a trapezoid shape, with a wider top side and a narrower bottom side. And the protective layer 42 is replaced with a protective case 74 fixed to the substrate 30 containing the first electrodes 32 by using a sealing glue 76.

Certainly, in the above embodiments, the bottom insulating pads can be formed by using insulating materials with moisture absorption function to improve dehumidification.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An organic electro-luminescence device comprising:
a substrate;
a plurality of elongate first electrodes formed on a surface of said substrate;
a plurality of organic layer divisions formed on said first electrodes to extend transversely relative thereto, each said organic layer division including at least one organic electro-luminescent layer, said organic layer divisions being spaced one from the others;
a plurality of second electrodes formed respectively on said organic layer divisions; and,
a plurality of rampart portions each disposed adjacent at least one of said organic layer divisions, each rampart portion extending upward from said first electrodes, each said rampart portion having a plurality of sections including a bottom insulating pad section and a heat sink section formed of a metallic material.

2. The organic electro-luminescence device as recited in claim 1 wherein each said rampart portion further includes an insulating stripe disposed on said heat sink section, said insulating stripe protruding laterally beyond said heat sink section to form an overhang portion of said rampart portion.

3. The organic electro-luminescence device as recited in claim 2 wherein adjacent ones of said overhang portions are laterally spaced by a separation distance, each said organic layer division being greater in width than said separation distance.

4. The organic electro-luminescence device as recited in claim 2 further comprising an overlaying protective layer.

5. The organic electro-luminescence device as recited in claim 4 wherein a plurality of spaces are defined between said protective layer and said rampart portion, beneath each said overhang portion.

6. The organic electro-luminescence device as recited in claim 4 wherein each said rampart portion includes a moisture absorbent section disposed between said heat sink and bottom insulating pad sections.

7. The organic electro-luminescence device as recited in claim 6 wherein a plurality of spaces are defined between said protective layer and said rampart portion, beneath each said overhang portion.

8. The organic electro-luminescence device as recited in claim 1 wherein said bottom insulating pad section of each said rampart portion is greater in thickness than said organic layer divisions.

9. The organic electro-luminescence device as recited in claim 8 wherein said bottom insulating pad section is greater in width than said bottom part of said heat sink section.

10. The organic electro-luminescence device as recited in claim 1 wherein said bottom insulating pad section of each said rampart portion is formed of a moisture absorbent insulating material.

11. The organic electro-luminescence device as recited in claim 1 wherein each said heat sink section is formed with a trapezoidal shape, each said heat sink section being greater in width at a top part thereof than a bottom part thereof.

12. The organic electro-luminescence device as recited in claim 1 wherein said organic layer divisions include a red light emitting organic layer division, a green light emitting organic layer division, and a blue light emitting organic layer division.

13. The organic electro-luminescence device as recited in claim 1 wherein said bottom insulating pad section is greater in width than said heat sink section.

14. The organic electro-luminescence device as recited in claim 13 wherein said bottom insulating pad section is greater in thickness than each said organic layer division.

15. An organic electro-luminescence device comprising:
a substrate;
a plurality of elongate first electrodes formed on a surface of said substrate;
a plurality of organic layer divisions formed on said first electrodes to extend transversely relative thereto, each said organic layer division including at least one organic electro-luminescent layer, said organic layer divisions being spaced one form the others;
a plurality of second electrodes formed respectively on said organic layer divisions;
a plurality of rampart portions each disposed adjacent at least one of said organic layer divisions, each rampart portion extending upward from said first electrodes to support an overhang portion, each said rampart portion having a plurality of sections including a bottom insulating pad section and a moisture absorbent section; and,
an overlaying protective case.

* * * * *